United States Patent
Yang et al.

(10) Patent No.: US 8,435,877 B2
(45) Date of Patent: May 7, 2013

(54) METHODS OF MANUFACTURING SEMICONDUCTOR DEVICES

(75) Inventors: Jun-Kyu Yang, Seoul (KR); Hong-Suk Kim, Yongin-si (KR); Ju-Yul Lee, Seoul (KR); Ki-Hyun Hwang, Seongnam-si (KR); Jae-Young Ahn, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/227,799

(22) Filed: Sep. 8, 2011

(65) Prior Publication Data
US 2012/0064707 A1   Mar. 15, 2012

(30) Foreign Application Priority Data
Sep. 14, 2010   (KR) .................. 10-2010-0089752

(51) Int. Cl.
*H01L 21/28* (2006.01)
(52) U.S. Cl.
USPC ....... 438/588; 438/264; 438/266; 257/E21.19
(58) Field of Classification Search .................. 438/264, 438/266, 588; 257/E21.19
See application file for complete search history.

(56) References Cited

U.S. PATENT DOCUMENTS

| | | | |
|---|---|---|---|
| 7,704,851 B2 | 4/2010 | Kim | |
| 2006/0231884 A1* | 10/2006 | Yonemochi et al. | 257/314 |
| 2008/0057666 A1* | 3/2008 | Kim | 438/422 |
| 2008/0128787 A1* | 6/2008 | Kato | 257/321 |
| 2009/0023279 A1* | 1/2009 | Kim et al. | 438/594 |
| 2009/0267131 A1 | 10/2009 | Nitta | |

FOREIGN PATENT DOCUMENTS
KR   10-2009-0092927 A   9/2009

\* cited by examiner

*Primary Examiner* — Angel Roman
(74) *Attorney, Agent, or Firm* — Lee & Morse, P.C.

(57) ABSTRACT

A semiconductor device includes gate structures including a tunnel insulating layer pattern, a floating gate, a dielectric layer pattern and a control gate sequentially disposed on a substrate. The control gate includes an impurity doped polysilicon layer pattern and a metal layer pattern. The gate structures are spaced apart from each other on the substrate. A capping layer pattern is disposed on a sidewall portion of the metal layer pattern and includes a metal oxide. An insulating layer covers the gate structures and the capping layer pattern. The insulating layer is formed on the substrate and includes an air-gap therein.

8 Claims, 11 Drawing Sheets

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ → SECOND DIRECTION

FIRST DIRECTION
⊗ → SECOND DIRECTION

FIRST DIRECTION
⊗——→ SECOND DIRECTION

FIRST DIRECTION
⊗——→ SECOND DIRECTION

SECOND DIRECTION
⊗ ⟶ FIRST DIRECTION

SECOND DIRECTION
⊗ ← FIRST DIRECTION

METHODS OF MANUFACTURING SEMICONDUCTOR DEVICES

BACKGROUND

1. Field

Example embodiments relate to semiconductor devices and methods of manufacturing the same. More particularly, example embodiments relate to semiconductor devices including an air-gap and methods of manufacturing the same.

2. Description of the Related Art

Recently, semiconductor devices such as non-volatile memory devices have been provided with an increased degree of integration.

SUMMARY

According to an example embodiment, there is provided a semiconductor device including an air-gap, the semiconductor device including gate structures, each of the gate structures including a tunnel insulating layer pattern, a floating gate, a dielectric layer pattern and a control gate sequentially disposed on a substrate, the control gate including an impurity doped polysilicon layer pattern and a metal layer pattern sequentially disposed on the dielectric layer, the gate structures being spaced apart from each other on the substrate, a capping layer pattern on a sidewall portion of the metal layer pattern and including a metal oxide, and an insulating layer covering the gate structures and the capping layer pattern, the insulating layer being disposed on the substrate and including an air-gap therein.

The metal layer pattern may include tungsten, and the capping layer pattern may include at least one of aluminum oxide, hafnium oxide and zirconium oxide.

The floating gate may include an impurity doped polysilicon.

The capping layer pattern may also be on part of a sidewall portion of the impurity doped polysilicon layer pattern.

Each gate structure may further include a gate mask on the metal layer pattern.

A thickness of the capping layer pattern may be in a range from about 50 angstroms to about 70 angstroms.

A width of the air-gap may gradually increase from an upper portion to a lower portion of the air-gap.

An upper surface portion of the air-gap may be positioned lower than an upper surface portion of the gate structures.

According to an example embodiment, there is provided a method of manufacturing a semiconductor device including forming gate structures by sequentially forming a tunnel insulating layer pattern, a floating gate, a dielectric layer pattern and a control gate including an impurity doped polysilicon layer pattern and a metal layer pattern on a substrate, the gate structures being spaced apart from each other on the substrate, forming a capping layer pattern including a metal oxide, the capping layer covering a sidewall portion of the metal layer pattern, and forming an insulating layer covering the gate structures and the capping layer pattern, the insulating layer being formed on the substrate and including an air-gap therein.

The capping layer pattern may include forming a capping layer covering the gate structures on the substrate, and removing the capping layer from sidewall portions of the tunnel insulating layer pattern, the floating gate, the dielectric layer pattern and the impurity doped polysilicon layer pattern through a wet etching process.

The forming of the capping layer may be executed by an atomic layer deposition process or a chemical vapor deposition process using a precursor of an organic metal compound and an oxygen gas precursor.

The metal layer pattern of the control gate may include tungsten. The precursor of the organic metal compound may include at least one of trimethyl aluminum (TMA), 1-methylpyrrolidine trimethylaluminum (MPTMA), tetrakis(ethylmethylamino)hafnium (TEMAH) and tetrakis(ethylmethylamino)zirconium (TEMAZ). The oxygen gas precursor may include an ozone ($O_3$) gas.

A thickness of the capping layer pattern formed on the sidewall portion of the metal layer pattern may be about eight to about ten times greater than a thickness, prior to removal, of the capping layer formed on the sidewall portions of the gate structures excluding the metal layer pattern.

The wet etching process may be performed using an aqueous hydrogen fluoride solution or an aqueous phosphoric acid solution.

After forming the capping layer pattern, the method may further include curing the sidewall portions of the gate structures.

The curing may be performed by a radical oxidation process or an annealing process using a nitrogen gas with respect to the sidewall portions of the gate structures.

According to an example embodiment, there is provided a semiconductor device including an air-gap, the semiconductor device including gate structures, each of the gate structures including a tunnel insulating layer pattern, a charge trapping layer pattern, a blocking layer pattern and a gate electrode sequentially disposed on a substrate, the gate electrode including an impurity doped polysilicon layer pattern and a metal layer pattern, the gate structures being spaced apart from each other on the substrate, a capping layer pattern on a sidewall portion of the metal layer pattern and including a metal oxide; and an insulating layer covering the gate structures and the capping layer pattern, the insulating layer being disposed on the substrate and including an air-gap therein.

The capping layer pattern may also be on part of a sidewall portion of the impurity doped polysilicon layer pattern.

Each gate structure may further include a gate mask on the metal layer pattern.

A thickness of the capping layer pattern may be in a range from about 50 angstroms to about 70 angstroms.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
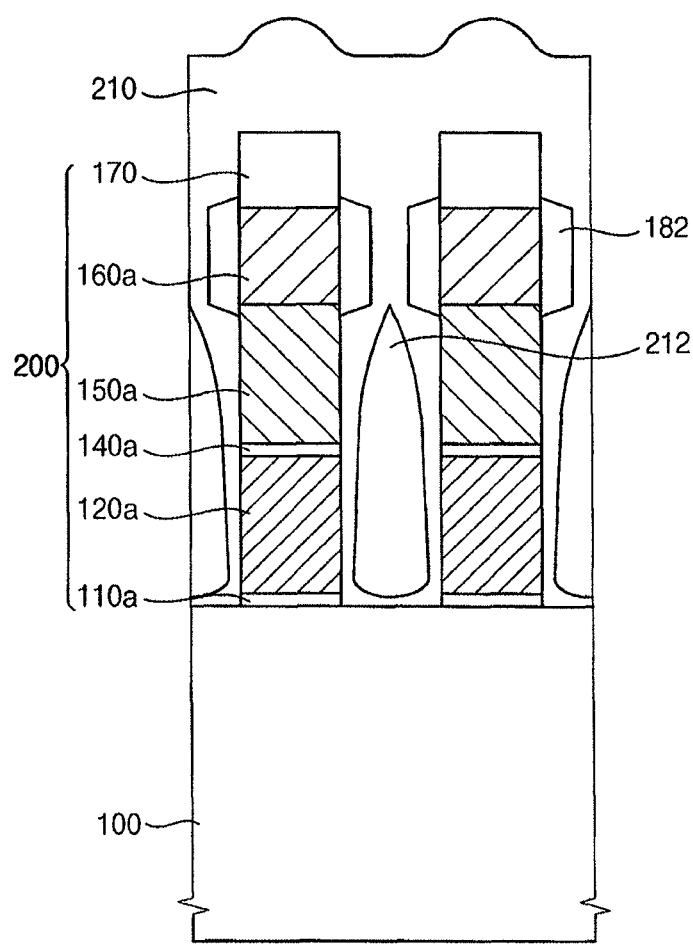
FIGS. 1 and 2 illustrate cross-sectional views explaining a semiconductor device in accordance with example embodiments.

Korean Patent Application No. 10-2010-0089752, filed on Sep. 14, 2010, in the Korean Intellectual Property Office, and entitled: "Semiconductor Devices and Methods of Manufacturing the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
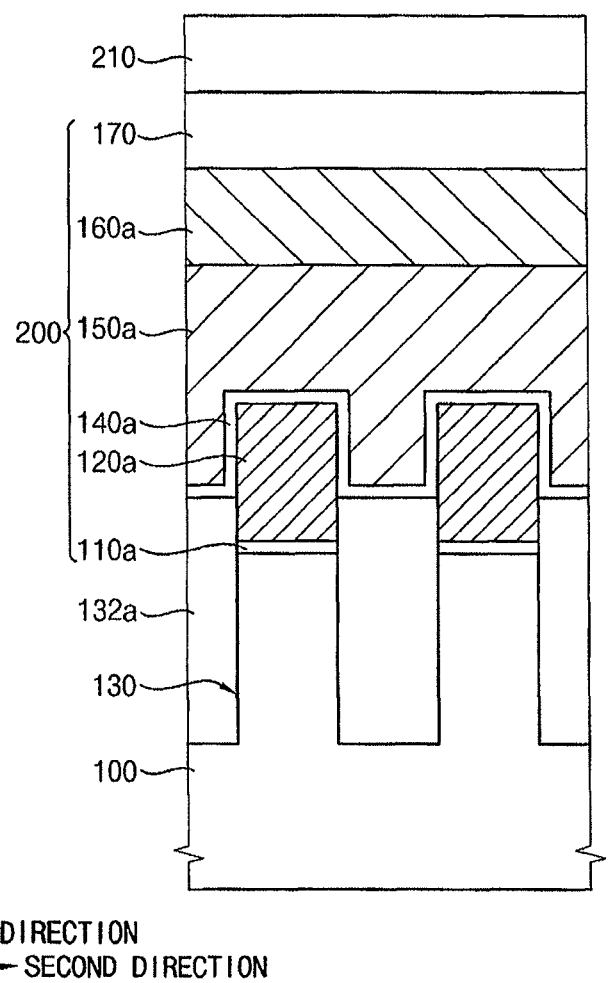

FIGS. 1 and 2 are cross-sectional views explaining a semiconductor device in accordance with example embodiments. FIG. 1 is a cross-sectional view cut along an extended direction of an active region of the semiconductor device and FIG. 2 is a cross-sectional view cut along an extended direction of a control gate of the semiconductor device.

Referring to FIGS. 1 and 2, the semiconductor device may include the following structures on a substrate 100: a plurality of gate structures 200, a capping layer pattern 182 formed on a portion of a sidewall portion of each gate structure 200, and an insulating layer 210 covering the gate structures 200 and the capping layer pattern 182, the insulating layer 210 including an air-gap 212 therein.

The substrate 100 may include a semiconductor material such as single crystalline silicon, silicon-germanium, etc. The substrate 100 may further include a well including p-type impurities or n-type impurities.

The substrate 100 may be divided into an active region and a field region by device isolating layer patterns 132a formed on the substrate 100. A region including the device isolating layer patterns 132a may be defined as the field region and a region excluding the device isolating layer patterns 132a may be defined as the active region. In accordance with example embodiments, each of the device isolating layer patterns 132a may extend in a first direction and a plurality of the device isolating layer patterns 132a may be formed in a second direction perpendicular to the first direction. Accordingly, the active region and the field region of the substrate 100 may also extend in the first direction and a plurality of the active regions and the field regions may be formed in the second direction.

Each of the gate structures 200 may include a tunnel insulating layer pattern 110a, a floating gate 120a, a dielectric layer pattern 140a and a control gate sequentially formed on the substrate 100. Each of the gate structures 200 may further include a gate mask 170 formed on the control gate.

The tunnel insulating layer pattern 110a may be formed on the active region of the substrate 100. In accordance with example embodiments, the tunnel insulating layer pattern 110a may have an isolated shape in the active region. Alternatively, the tunnel insulating layer pattern 110a may extend in the first direction on the active region. The tunnel insulating layer pattern 110a may include silicon oxide.

The floating gate 120a may have an isolated shape, like the tunnel insulating layer pattern 110a, on the active region or may extend in the first direction. In accordance with example embodiments, the floating gate 120a may have substantially the same area as the tunnel insulating layer pattern 110a. The floating gate 120a may include an impurity doped polysilicon. In accordance with example embodiments, the floating gate 120a may be doped with an n-type impurity such as phosphor (P) or arsenic (As).

The dielectric layer pattern 140a may be formed on the floating gate 120a. In accordance with example embodiments, the dielectric layer pattern 140a may extend in the second direction on the floating gate 120a and the device isolating layer patterns 132a. The dielectric layer pattern 140a may include a metal oxide having a high dielectricity. Alternatively, the dielectric layer pattern 140a may have an ONO (oxide/nitride/oxide) structure including an oxide layer, a nitride layer and an oxide layer.

The control gate may include an impurity doped polysilicon layer pattern 150a and a metal layer pattern 160a sequentially integrated onto the dielectric layer pattern 140a. In accordance with example embodiments, the impurity doped polysilicon layer pattern 150a and the metal layer pattern 160a may extend in the second direction.

In example embodiments, the impurity doped polysilicon layer pattern 150a may include n-type impurity doped polysilicon.

In example embodiments, the metal layer pattern 160a may include tungsten. According to an embodiment, the metal layer pattern 160a may include tungsten and a metal nitride. The metal nitride may include at least one of tungsten nitride, titanium nitride, tantalum nitride, etc.

The capping layer pattern 182 may be formed on a sidewall portion of the metal layer pattern 160a. In example embodiments, the capping layer pattern 182 may have a thickness from about 50 angstroms to about 70 angstroms. The capping layer pattern 182 may be also formed on a portion of a sidewall portion of the doped polysilicon layer pattern 150a.

The capping layer pattern 182 may include a material having a faster depositing rate with respect to a surface portion of a metal layer, as compared to a surface portion of a silicon layer or a silicon oxide layer. The material may have a lower removing efficiency by a wet etching process with respect to the metal layer as compared to the silicon layer or the silicon oxide layer. In example embodiments, the capping layer pattern 182 may include a metal oxide such as aluminum oxide, hafnium oxide, zirconium oxide, etc.

In example embodiments, the gate mask 170 may extend on the metal layer pattern 160a in the second direction. The gate mask 170 may include silicon nitride.

On the substrate 100 adjacent to the gate structures 200, impurity doped source/drain regions (not illustrated) may be formed.

The insulating layer 210 may include an oxide such as silicon oxide.

In example embodiments, an upper surface portion of the air-gap 212 within the insulating layer 210 may be positioned lower than an upper surface portion of the gate structures 200. The width of the air-gap 212 in the first direction may gradually increase from the upper portion to the bottom portion. The air-gap 212 may have a line shape extending in the second direction.

The air-gap 212 may be formed between the gate structures 200. Accordingly, channel coupling between the gate structures 200 may be decreased, and a programming characteristic of a semiconductor device including the air-gap 212 may be improved. The term "channel coupling" may refer to a phenomenon wherein an increase of a threshold voltage of a cell is generated by a decrease of a channel potential of the cell with respect to a neighboring programmed cell due to interference between the cells when a program voltage is applied to a memory cell.

A curing layer including silicon oxide may be formed on a sidewall portion of each gate structure 200.

The above-described explanation relates to a floating gate type flash memory device. However, the example embodiments may also include a charge trap type flash memory device.

Figure 3:
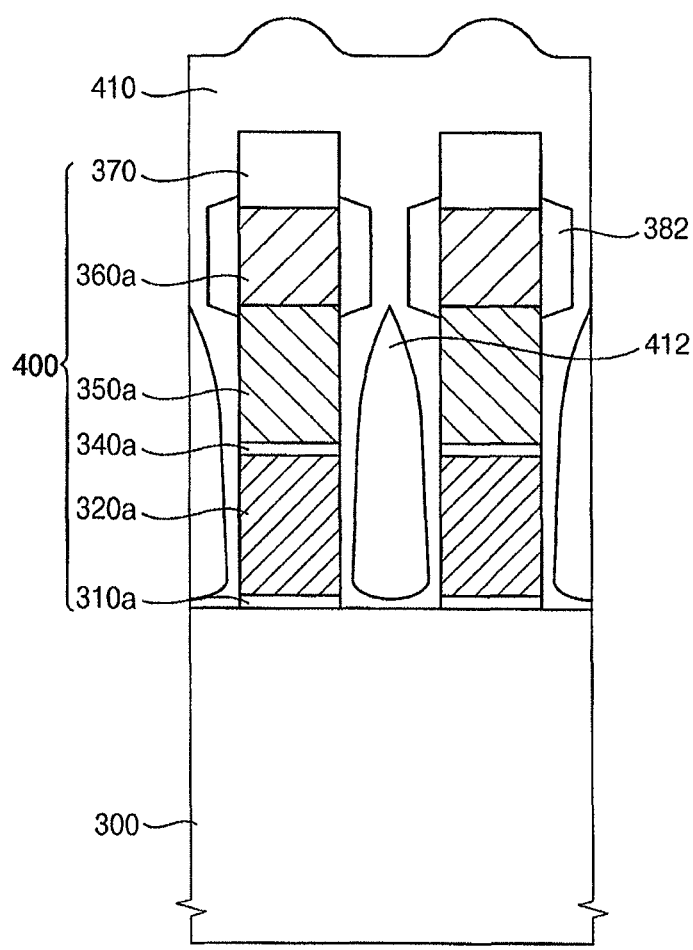
FIG. 3 illustrates a cross-sectional view explaining a semiconductor device in accordance with another example embodiment.

FIG. 3 is a cross-sectional view explaining a semiconductor device including the charge trap type flash memory device in accordance with another example embodiment.

Referring to FIG. 3, the semiconductor device may include the following structures on a substrate 300: a plurality of gate structures 400, a capping layer pattern 382 formed on a portion of a sidewall portion of each gate structure 400, and an insulating layer 410 covering the gate structures 400 and the capping layer pattern 382, the insulating layer 410 including an air-gap 412 therein.

The gate structure 400 may include a tunnel insulating layer pattern 310a, a charge trapping layer pattern 320a, a blocking layer pattern 340a and a gate electrode, sequentially formed. The charge trapping layer pattern 320a may include silicon nitride, polysilicon, etc. The gate electrode may included an impurity doped polysilicon layer pattern 350a and a metal layer pattern 360a sequentially integrated. Each of the gate structures 400 may further include a gate mask 370 formed on the gate electrode.

Hereinafter, a method of manufacturing a semiconductor device in example embodiments will be described in detail in accordance with a process flow.

FIGS. 4 to 13 are cross-sectional views explaining a method of manufacturing a semiconductor device illustrated in FIGS. 1 and 2 in accordance with example embodiments. FIGS. 4 to 8 are cross-sectional views cut along an extended direction of the active region of the semiconductor device and FIGS. 9 to 13 are cross-sectional views cut along an extended direction along the control gate of the semiconductor device.

Figure 4:
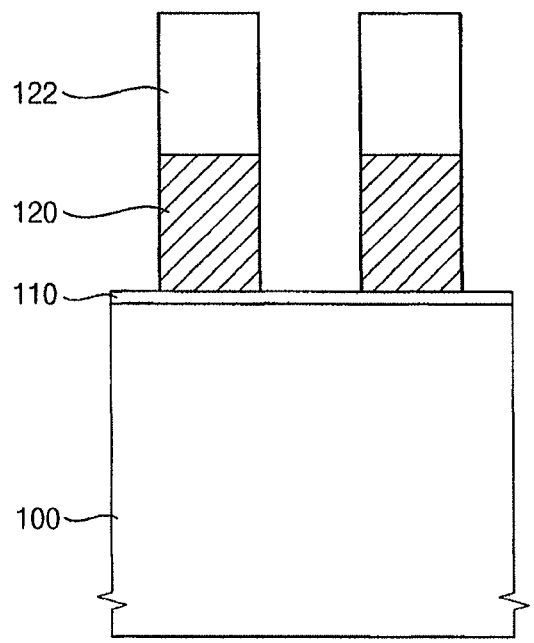
FIGS. 4 to 13 illustrate cross-sectional views explaining a method of manufacturing a semiconductor device illustrated in FIGS. 1 and 2 in accordance with example embodiments.

Referring to FIG. 4, a tunnel insulating layer 110 may be formed on a substrate 100.

The substrate 100 may include a semiconductor material such as single crystalline silicon, silicon-germanium, etc. The substrate 100 may further include a well doped with p-type impurities or n-type impurities.

In example embodiments, the tunnel insulating layer 110 may be formed through a thermal oxidation of an upper portion of the substrate 100. Alternatively, the tunnel insulating layer 110 may be formed by a chemical vapor deposition (CVD) process using silicon oxide, silicon oxynitride, impurity doped silicon oxide, etc.

A floating gate layer and a hard mask layer may be formed on the tunnel insulating layer 110.

In example embodiments, the floating gate layer may be formed using doped polysilicon. The floating gate layer may be formed by depositing a polysilicon layer on the tunnel insulating layer 110 by a low pressure chemical vapor deposition (LPCVD) process and then, doping n-type impurities into the polysilicon layer.

The hard mask layer may be formed using silicon oxide in the CVD process.

The hard mask layer may be patterned through photolithography to form hard masks 122 on the floating gate layer. The floating gate layer may be etched using the hard masks 122 as an etching mask to form a plurality of preliminary floating gates 120. In example embodiments, each preliminary floating gate 120 may have a line shape extending in the first direction, and a plurality of the preliminary floating gates 120 may be formed in the second direction perpendicular to the first direction.

Figure 5:
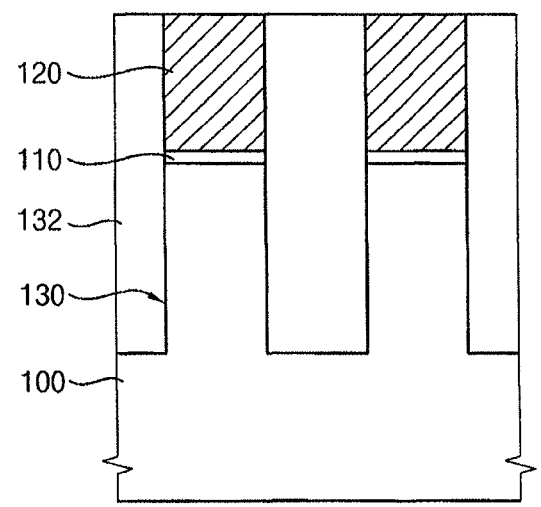

Referring to FIG. 5, the tunnel insulating layer 110 and the substrate 100 may be etched sequentially using the hard masks 122 and the preliminary floating gates 120 as an etching mask to form trenches 130 at an upper portion of the substrate 100. Each of the tunnel insulating layers 110 may extend in the first direction and a plurality of the tunnel insulating layers 110 may be spaced apart in the second direction. In addition, each of the trenches 130 may also extend in the first direction and a plurality of the trenches 130 may be spaced apart in the second direction.

A first insulating layer (not illustrated), filling up a space formed between the tunnel insulating layer 110 and the preliminary floating gate 120 and filling up the trenches 130, may be formed on the substrate 100. In example embodiments, the first insulating layer may be formed by one of a CVD process, a plasma enhanced chemical vapor deposition (PE-CVD) process, a high density-plasma chemical vapor deposition (HDP-CVD) process and an ALD process. The first insulating layer may be formed using silicon oxide such as borophosphosilicate glass (BPSG), phosphosilicate glass (PSG), undoped silicate glass (USG), spin-on glass (SOG), flowable oxide film (FOX), tetraethyl orthosilicate (TEOS), plasma enhanced TEOS (PE-TEOS), or HDP-CVD oxide. These materials may be used alone or in combination thereof.

An upper portion of the first insulating layer may be planarized until an upper surface portion of the hard mask 122 is exposed. A plurality of device isolation layers 132 extending in the first direction may be formed. The device isolation layers 132 may be spaced apart in the second direction.

Then, the hard masks 122 may be removed.

Figure 6:
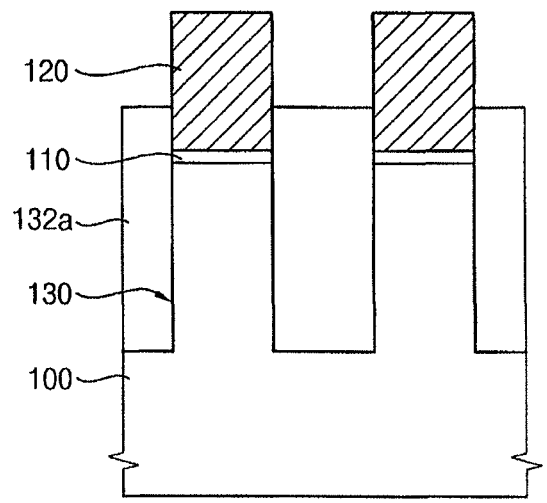

Referring to FIG. 6, an upper portion of the device isolation layers 132 may be etched to expose sidewall portions of the preliminary floating gates 120 and to form device isolation layer patterns 132a. In example embodiments, the etching process may be performed by a wet etching process. In addition, the etching process may be controlled so that an upper surface portion of the device isolation layer patterns 132a is higher than an upper surface portion of the tunnel insulating layer 110.

Figure 7:
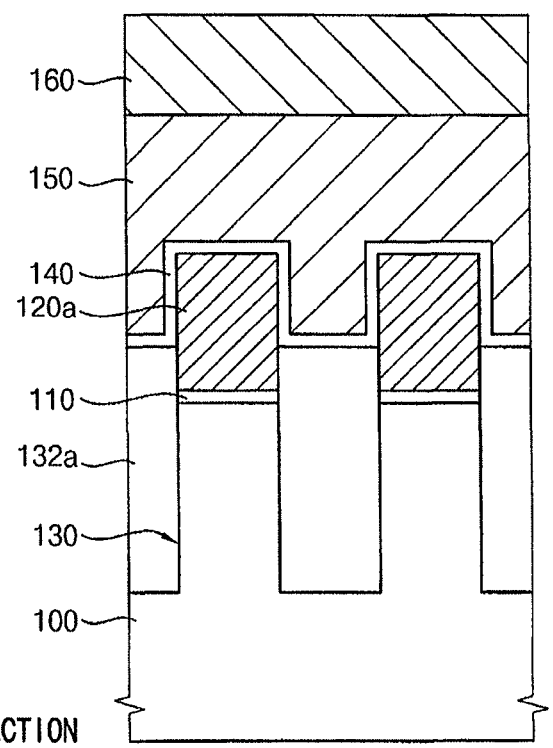

Referring to FIG. 7, a dielectric layer 140 may be formed on the preliminary floating gate 120 and the device isolation layer pattern 132a.

The dielectric layer may be formed using an oxide compound or a nitride compound. In example embodiments, the dielectric layer 140 may be formed to have an ONO structure including an oxide layer/nitride layer/oxide layer. Alternatively, the dielectric layer 140 may be formed using a metal oxide having a high dielectricity to increase capacitance and to improve leakage current characteristic. The metal oxide having high dielectricity may include hafnium oxide, titanium oxide, tantalum oxide, zirconium oxide, aluminum oxide, etc.

A control gate layer may be formed on the dielectric layer 140. In example embodiments, the control gate layer may include an impurity doped polysilicon layer 150 and a metal layer 160 and may be formed by sequentially depositing impurity doped polysilicon and a metal.

In example embodiments, the impurity doped polysilicon layer 150 may be formed using polysilicon doped with n-type impurities.

In example embodiments, a metal layer 160 may be formed using tungsten (W). According to an embodiment, the metal layer 160 may be formed using tungsten and a metal nitride. The metal nitride may include tungsten nitride, titanium nitride, tantalum nitride, etc.

Figure 8:
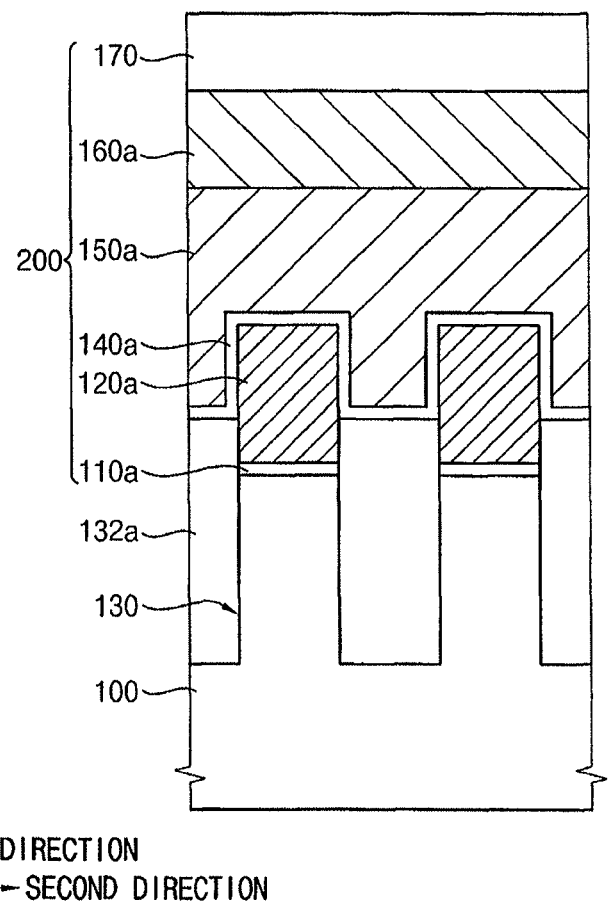
Figure 9:
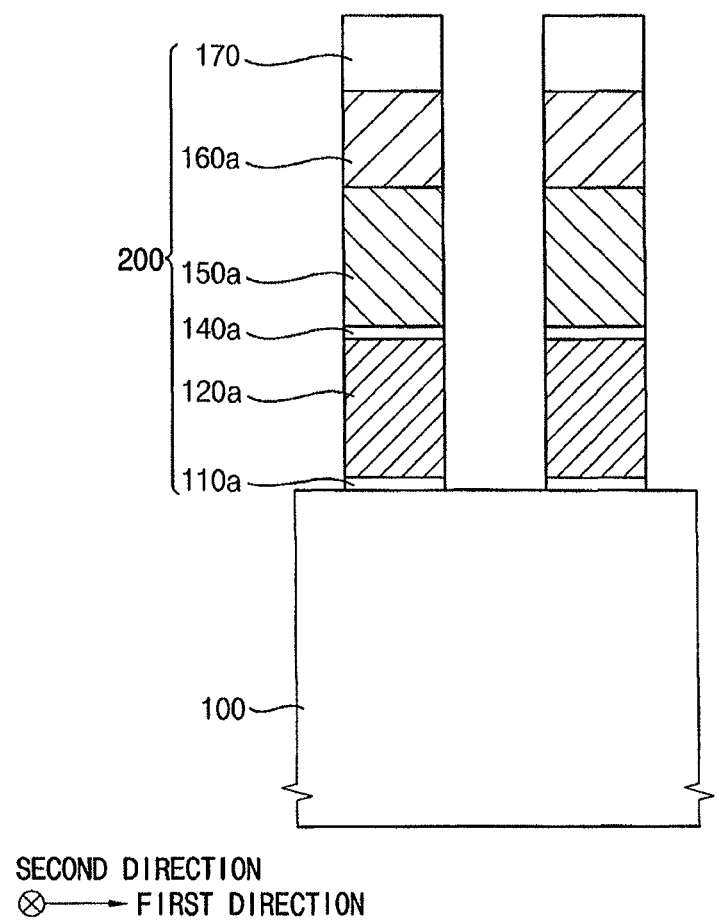

Referring to FIGS. 8 and 9, gate masks 170 may be formed on the metal layer 160. A gate mask layer (not illustrated) may be formed using silicon nitride on the metal layer 160 and then, the gate mask layer may be patterned through photolithography to form the gate masks 170. In example embodiments, each of the gate masks 170 may extend in the second direction and a plurality of the gate masks 170 may be spaced apart in the first direction.

The metal layer 160 may be etched using the gate masks 170 as an etching mask to form metal layer patterns 160a extending in the second direction and spaced apart from each other in the first direction. Then, the impurity doped polysilicon layer 150, the dielectric layer 140, the preliminary floating gate 120 and the tunnel insulating layer 110 may be etched using the gate masks 170 and the metal layer patterns 160a as an etching mask to sequentially form a tunnel insulating layer pattern 110a, a floating gate 120a, a dielectric layer pattern 140a and an impurity doped polysilicon layer pattern 150a.

The gate structures 200 may be formed. Each of the gate structures 200 may include the tunnel insulating layer pattern 110a, the floating gate 120a, the dielectric layer pattern 140a, the impurity doped polysilicon layer pattern 150a, the metal layer pattern 160a, and the gate mask 170 sequentially integrated on the substrate. In example embodiments, the tunnel insulating layer pattern 110a and the floating gate 120a may be formed to have an isolation shape on the active region of the substrate 100. In addition, each of the dielectric layer pattern 140a, the impurity doped polysilicon layer pattern 150a, the metal layer pattern 160a, and the gate mask 170 may extend in the second direction.

The gate structures 200 may be formed in a cell region (not illustrated) and a peripheral circuit region (not illustrated) of the substrate 100, respectively. The gate structures 200 formed in the cell region may form, for example, 16 or 32 word lines, and a string selecting line (SSL) and a ground selecting line (GSL) surrounding the word lines.

Figure 10:
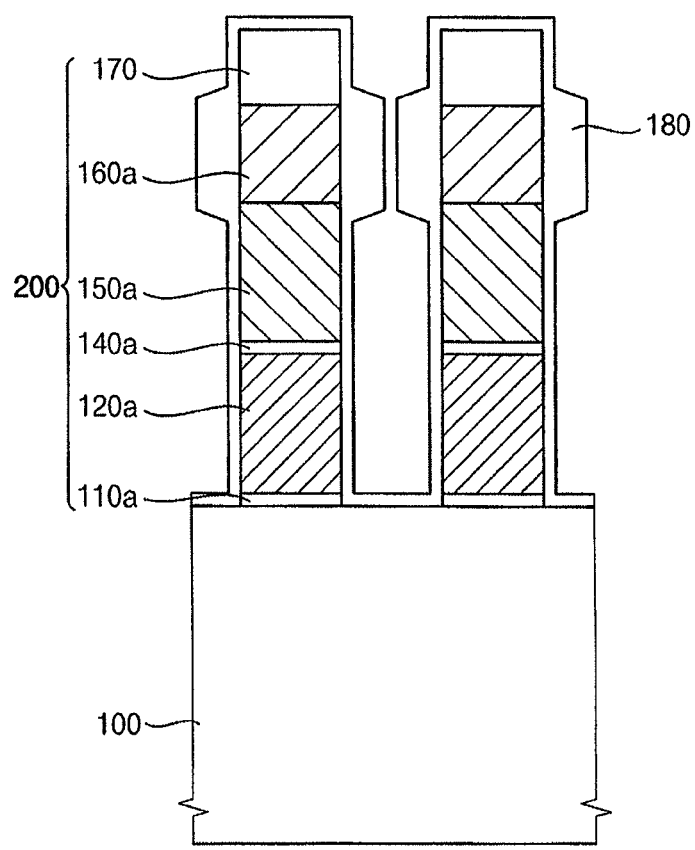

Referring to FIG. 10, a capping layer 180 may be formed on the gate structures 200 and the substrate 100.

In example embodiments, the capping layer 180 may be formed by an ALD process, a CVD process, etc. using a precursor of an organic metal compound and an oxygen gas precursor.

In example embodiments, the precursor of the organic metal compound may include a trimethyl aluminum (TMA) gas or a 1-methylpyrrolidine trimethyl aluminum (MPTMA) gas. The oxygen gas precursor may include an ozone ($O_3$) gas. Accordingly, the capping layer 180 may include aluminum oxide.

According to an embodiment, the precursor of the organic metal compound may include tetrakis(ethylmethylamino) hafnium (TEMAH) gas. In this case, the capping layer 180 including hafnium oxide may be formed. The precursor of the organic metal compound may include tetrakis(ethylmethylamino)zirconium (TEMAZ) gas. In this case, a capping layer 180 including zirconium oxide may be formed. The capping layer 180 may be formed as a complex layer of an aluminum oxide layer/hafnium oxide layer or an aluminum oxide layer/zirconium oxide layer.

In example embodiments, the ALD process or the CVD process may be executed at a temperature range from about 300° C. to about 600° C. under an atmosphere from about 0.1 Torr to about 2 Torr.

The capping layer 180 formed on the sidewall portion of the metal layer pattern 160a of the gate structures 200 may be formed to have a thickness greater than that of the capping layer 180 formed on other parts of the sidewall portion excluding the metal layer pattern 160a. That is, an incubation time required for depositing the metal oxide such as aluminum oxide on the surface portion of the substrate 100, the tunnel insulating layer pattern 110a, the floating gate 120a, the dielectric layer pattern 140a, the impurity doped polysilicon layer pattern 150a and the gate mask 170 including silicon, silicon oxide, silicon nitride, etc. may be longer than the incubation time required for depositing the metal oxide on the surface portion of the metal layer pattern 160a including a metal such as tungsten. Accordingly, the capping layer 180 formed on the sidewall portion of the metal layer pattern 160a may be relatively thick.

In example embodiments, the thickness of the capping layer 180 formed on the sidewall portion of the metal layer pattern 160a may be about eight to about ten times larger than the thickness of the capping layer 180 formed on the sidewall portion of the gate structures 200 excluding the metal layer pattern 160a. When the thick capping layer 180 is formed on the sidewall portion of the metal layer pattern 160a, exposure of the surface portion of the metal layer pattern 160a to the air may be prevented. Accordingly, growing of tungsten oxide to a whisker may be restrained and a generation of an electric short between the gate structures 200 may be prevented.

Figure 11:
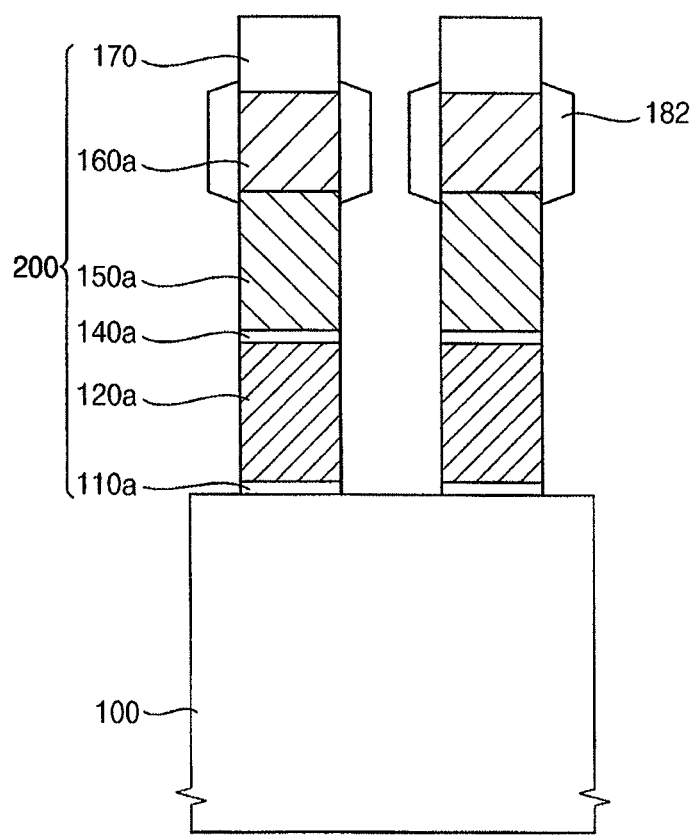

Referring to FIG. 11, a wet etching process may be performed with respect to the capping layer 180 to form a capping layer pattern 182 covering the sidewall portion of the metal layer pattern 160a of the gate structures 200.

In example embodiments, the wet etching process may be executed using an aqueous hydrogen fluoride (HF) solution including hydrogen and fluorine in a mixing ratio of about 200:1 by volume or an aqueous phosphoric acid solution. The aqueous hydrogen fluoride solution and the aqueous phosphoric acid solution may have a high etching selectivity between the metal oxide, such as aluminum oxide, and silicon or silicon oxide. Particularly, the aqueous hydrogen fluoride solution may etch aluminum oxide faster than silicon oxide by a factor of about three. Accordingly, the surface portion of the substrate 100, the tunnel insulating layer pattern 110a, the floating gate 120a, the dielectric layer pattern 140a and the impurity doped polysilicon layer pattern 150a may be scarcely damaged while the capping layer 180 is removed through the wet etching process.

According to an embodiment, the capping layer pattern 182 may be formed on the sidewall portion of the metal layer pattern 160a and as a residue only on a portion of the sidewall portion of the impurity doped polysilicon layer pattern 150a adjacent to the metal layer pattern 160a.

Figure 12:
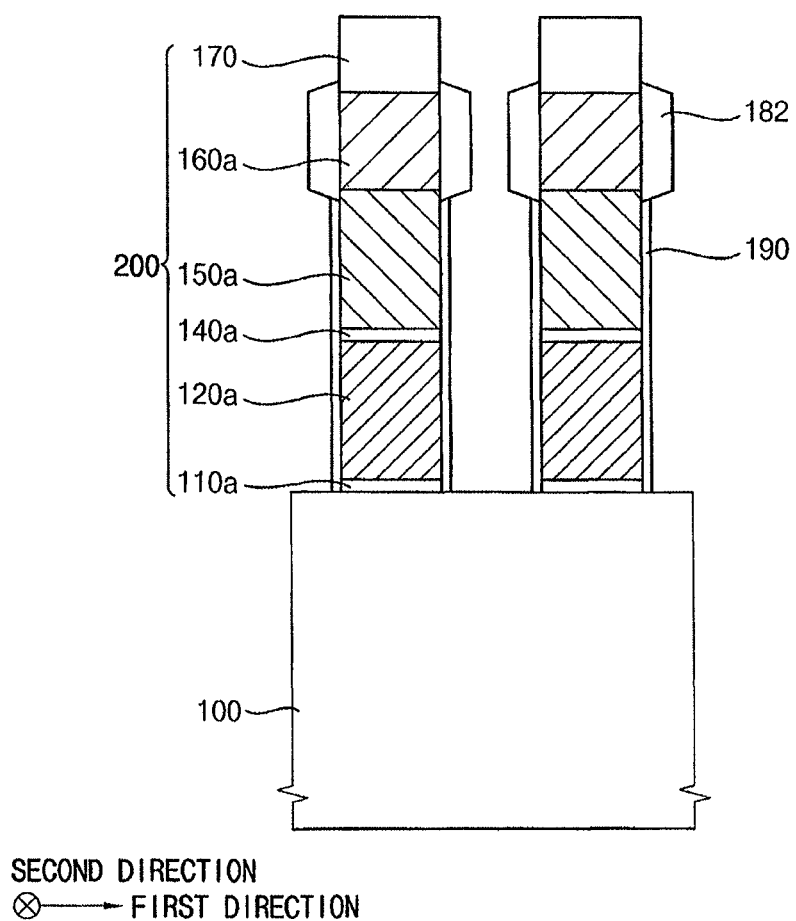

Referring to FIG. 12, a curing layer 190 may be formed on the sidewall portion of the tunnel insulating layer pattern 110a, the floating gate 120a, the dielectric layer pattern 140a and the impurity doped polysilicon layer pattern 150a and on the surface portion of the substrate 100.

In example embodiments, the curing layer 190 may be formed by a radical oxidation process or an annealing process using a nitrogen gas. The curing layer 190 may include silicon oxide or silicon nitride. Damaged portions of the surface portion of the substrate 100 and the sidewall portion of the tunnel insulating layer pattern 110a, the floating gate 120a, the dielectric layer pattern 140a and the impurity doped polysilicon layer pattern 150a may be cured using the curing layer 190.

Figure 13:
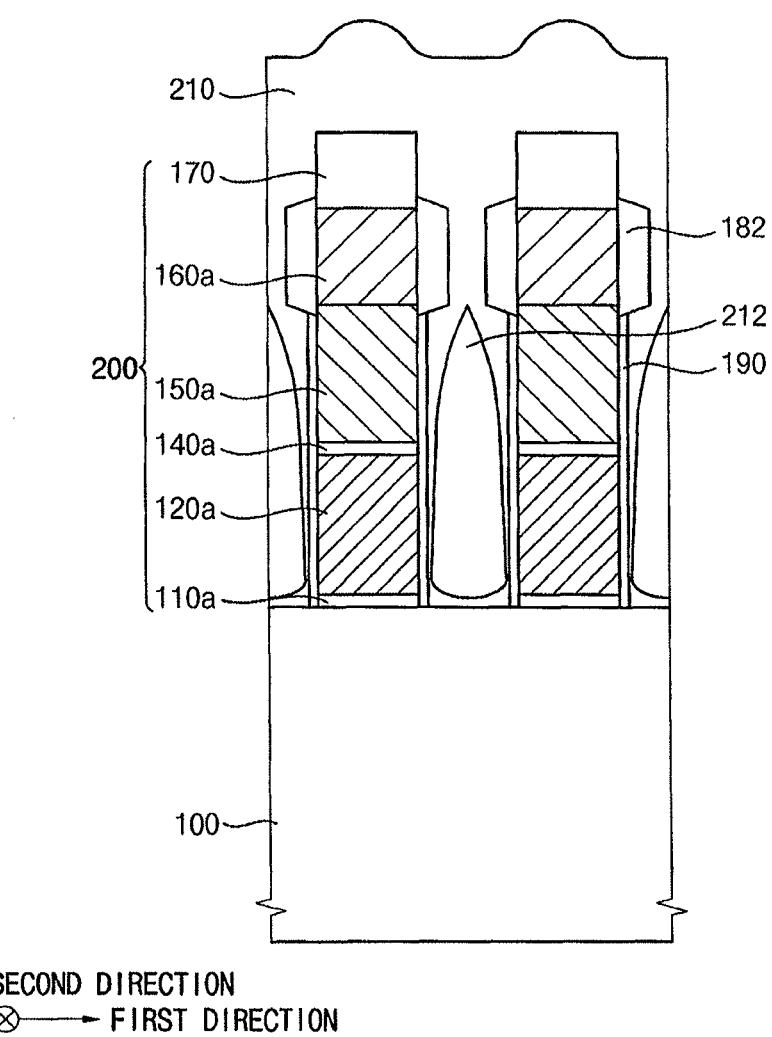

Referring to FIG. 13, an insulating layer 210 covering the gate structures 200 and the capping layer pattern 182 may be formed on the substrate 100 to fill up the space between the gate structures 200. In this case, the insulating layer 210 may not completely fill up the space between the gate structures 200 but may form an air-gap 212 between the gate structures 200. Particularly, the air-gap 212 may have an extended shape in the second direction. An air-gap with an extended shape may be referred to as an "air tunnel."

The insulating layer 210 may be formed by one of a CVD process, a PE-CVD process and an LP-CVD process using silicon oxide such as a plasma enhanced oxide (PEOX) and a medium temperature oxide (MTO). The insulating layer 210 may be formed using silicon oxide by a process exhibiting a low step coverage characteristic, so that the air-gap 212 may be formed within the insulating layer 210.

In example embodiments, the insulating layer 210 may be formed by a radical oxidation process using an oxygen ($O_2$) gas as a reacting gas, by a wet oxidation process using a mixture of an oxygen ($O_2$) gas and water vapor ($H_2O$), or by an NO gas oxidation process using a nitrogen monoxide (NO) gas and a hydrogen ($H_2$) gas, etc.

In example embodiments, an upper surface portion of the air-gap 212 in the insulating layer 210 may be lower than an upper surface portion of the gate structures 200. Particularly, the air-gap 212 may be formed at a lower position when compared to the capping layer pattern 182. In example embodiments, the width of the air-gap 212 in the first direction may gradually increase from the upper portion to the lower portion. The air-gap 212 may have a line shape extending in the second direction.

A portion of the gate insulating layer 210 may be removed to form an insulating layer pattern (not illustrated) covering the gate structures 200 and exposing a portion of the surface portion of the substrate 100 adjacent to the gate structures 200.

An insulating interlayer (not illustrated) covering the insulating layer pattern may be formed on the substrate 100, and a bit line contact (not illustrated) penetrating the insulating interlayer and making a contact with an exposed upper surface portion of the substrate 100 may be formed. A bit line (not illustrated) making an electric contact with the bit line contact may be formed.

Through performing the above-described processes, the semiconductor device in accordance with example embodiments may be manufactured.

The method of manufacturing the floating type flash memory device as described above may be also applied for the manufacture of a charge trap type flash memory device in accordance with another example embodiment. That is, gate structures including a tunnel insulating layer pattern, a charge trapping layer pattern, a blocking layer pattern and a gate electrode may be formed sequentially on a substrate. The charge trapping layer pattern may be formed using silicon nitride, polysilicon, etc. The gate electrode may be formed by sequentially integrating an impurity doped polysilicon layer pattern and a metal layer pattern.

By way of summation and review, as an integration degree of a semiconductor device increases, threshold voltage characteristics may be undesirably changed due to a parasitic capacitance between floating gates of a non-volatile memory device. Accordingly, it is desirable to provide methods of manufacturing a semiconductor device having a reduced parasitic capacitance. However, a method such as forming an air-gap between word lines may involve a complicated process if the air-gap is formed between word lines after forming a spacer. Further, a control gate including a metal may be oxidized while forming an insulating layer including the air-gap.

In this regard, the embodiments disclosed herein advance the art by providing a capping layer pattern formed on a sidewall portion of a metal layer pattern of each gate structure to narrow a space between the gate structures at an upper portion of the gate structures. Accordingly, an insulating layer having an air-gap having a large volume may be effectively formed between the gate structures. In addition, the metal layer pattern may be passivated by the capping layer pattern and a generation of a whisker at the metal layer pattern may be prevented. Further, a curing process including a radical oxidation process or an annealing process may be effectively performed with respect to sidewall portions of the gate structures. Accordingly, embodiments described herein may provide a semiconductor device having a good electric characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming gate structures by sequentially forming a tunnel insulating layer pattern, a floating gate, a dielectric layer pattern and a control gate including an impurity doped polysilicon layer pattern and a metal layer pattern on a substrate, the gate structures being spaced apart from each other on the substrate;
   forming a capping layer pattern including a metal oxide, the capping layer pattern covering a sidewall portion of the metal layer pattern; and
   forming an insulating layer covering the gate structures and the capping layer pattern, the insulating layer being formed on the substrate and including an air-gap therein.

2. The method as claimed in claim 1, wherein the forming of the capping layer pattern includes:
   forming a capping layer covering the gate structures on the substrate; and
   removing the capping layer from sidewall portions of the tunnel insulating layer pattern, the floating gate, the dielectric layer pattern and the impurity doped polysilicon layer pattern through a wet etching process.

3. The method as claimed in claim 1, wherein the forming of the capping layer is executed by an atomic layer deposition process or a chemical vapor deposition process using a precursor of an organic metal compound and an oxygen gas precursor.

4. The method as claimed in claim 3, wherein:
the metal layer pattern of the control gate includes tungsten,
the precursor of the organic metal compound includes at least one of trimethyl aluminum (TMA), 1-methylpyrrolidine trimethylaluminum (MPTMA), tetrakis(ethylmethylamino)hafnium (TEMAH) and tetrakis(ethylmethylamino)zirconium (TEMAZ), and
the oxygen gas precursor includes an ozone ($O_3$) gas.

5. The method as claimed in claim 1, wherein a thickness of the capping layer pattern formed on the sidewall portion of the metal layer pattern is about eight to about ten times greater than a thickness, prior to removal, of the capping layer formed on the sidewall portions of the gate structures excluding the metal layer pattern.

6. The method as claimed in claim 1, wherein the wet etching process is performed using an aqueous hydrogen fluoride solution or an aqueous phosphoric acid solution.

7. The method as claimed in claim 1, further comprising, after forming the capping layer pattern:
curing the sidewall portions of the gate structures.

8. The method as claimed in claim 7, wherein the curing is performed by a radical oxidation process or an annealing process using a nitrogen gas with respect to the sidewall portions of the gate structures.

* * * * *